US008598020B2

(12) United States Patent
Nguyen et al.

(10) Patent No.: US 8,598,020 B2
(45) Date of Patent: Dec. 3, 2013

(54) PLASMA-ENHANCED CHEMICAL VAPOR DEPOSITION OF CRYSTALLINE GERMANIUM

(75) Inventors: Victor Nguyen, Novato, CA (US); Mihaela Balseanu, Sunnyvale, CA (US); Li-Qun Xia, Cupertino, CA (US); Derek R Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 141 days.

(21) Appl. No.: 12/824,095

(22) Filed: Jun. 25, 2010

(65) Prior Publication Data

US 2011/0315992 A1 Dec. 29, 2011

(51) Int. Cl.
H01L 21/20 (2006.01)

(52) U.S. Cl.
USPC ............... 438/488; 257/66; 257/E21.09

(58) Field of Classification Search
USPC ............... 438/488; 257/66, E21.09
See application file for complete search history.

(56) References Cited

U.S. PATENT DOCUMENTS

| 4,740,829 | A | * | 4/1988 | Nakagiri et al. ............... 257/65 |
| 5,094,929 | A | * | 3/1992 | Yagi et al. ................ 430/60 |
| 5,951,757 | A | | 9/1999 | Dubbelday et al. |
| 6,228,692 | B1 | * | 5/2001 | Tsutsu ................ 438/164 |
| 6,806,158 | B2 | * | 10/2004 | Sukegawa et al. ......... 438/309 |
| 6,887,511 | B1 | | 5/2005 | Shima et al. |
| 7,166,528 | B2 | | 1/2007 | Kim et al. |
| 7,189,639 | B2 | | 3/2007 | Krishnaraj et al. |
| 7,262,116 | B2 | | 8/2007 | Singh et al. |
| 2003/0183901 | A1 | * | 10/2003 | Kanda et al. ............ 257/510 |
| 2004/0175893 | A1 | | 9/2004 | Vatus et al. |
| 2005/0173705 | A1 | * | 8/2005 | Kondo et al. ............ 257/65 |
| 2007/0111521 | A1 | * | 5/2007 | Wilk ............ 438/680 |
| 2007/0235074 | A1 | | 10/2007 | Henley et al. |
| 2007/0262296 | A1 | | 11/2007 | Bauer |
| 2007/0278494 | A1 | * | 12/2007 | Kermarec et al. ............ 257/75 |
| 2008/0135890 | A1 | * | 6/2008 | Nakagawa et al. ......... 257/288 |
| 2008/0188062 | A1 | | 8/2008 | Chen et al. |
| 2009/0108254 | A1 | * | 4/2009 | Lee et al. ............ 257/40 |
| 2009/0162973 | A1 | | 6/2009 | Gatineau et al. |
| 2010/0120235 | A1 | | 5/2010 | Huang et al. |
| 2010/0159676 | A1 | * | 6/2010 | Lieten ............ 438/487 |
| 2010/0273322 | A1 | * | 10/2010 | Papasouliotis et al. ....... 438/527 |

FOREIGN PATENT DOCUMENTS

| WO | WO2007002569 | 1/2007 |
| WO | WO2009013034 | 1/2009 |
| WO | WO2009013242 | 1/2009 |

OTHER PUBLICATIONS

Search Report of PCT/US2011/040587, KIPO, Republic of Korea, Feb. 17, 2012.

* cited by examiner

Primary Examiner — Alexander Ghyka
Assistant Examiner — Stanetta Isaac
(74) Attorney, Agent, or Firm — Ashok K. Janah; Janah & Associates, P.C.

(57) ABSTRACT

In a method of depositing a crystalline germanium layer on a substrate, a substrate is placed in the process zone comprising a pair of process electrodes. In a deposition stage, a crystalline germanium layer is deposited on the substrate by introducing a deposition gas comprising a germanium-containing gas into the process zone, and forming a capacitively coupled plasma of the deposition gas by coupling energy to the process electrodes. In a subsequent treatment stage, the deposited crystalline germanium layer is treated by exposing the crystalline germanium layer to an energized treatment gas or by annealing the layer.

29 Claims, 5 Drawing Sheets

PLASMA-ENHANCED CHEMICAL VAPOR DEPOSITION OF CRYSTALLINE GERMANIUM

BACKGROUND

Embodiments of the present invention relate to the deposition of crystalline germanium in the fabrication of electronic, optoelectronic, and photovoltaic circuits.

Crystalline germanium (Ge) is used in many applications of electronic devices, including semiconductor, optoelectronic and photovoltaic devices, e.g., memory devices, photo detectors, and photovoltaic cells. For example, single and multi-layer crystalline germanium films are used to make high-efficiency multijunction photovoltaic cells that have multiple thin films of semiconductors such as gallium arsenide, gallium indium phosphide, and germanium p-n junctions. Each type of semiconductor has a characteristic band gap energy which causes it to absorb light most efficiently at a certain wavelength that represents a portion of the electromagnetic spectrum. Crystalline germanium layers are also used as photodetectors in optical interconnects to convert optical signals to electrical signals. Optical interconnects are used to connect optical pathways, waveguides, and optical fibers for transmitting optical signals comprising information, code or data. For example, optical interconnects are used in integrated circuit chips to replace metal interconnects in complementary metal oxide semiconductor (CMOS) structures because of their relatively smaller size, faster speed and higher data-carrying capacity than metal interconnects. Crystalline germanium is particularly useful in the manufacture of photodetectors because conventional silicon photodetectors cannot detect the near-infrared light that is often used for optical communications. These high performance photodetectors are made by forming crystalline germanium layers on dielectric substrates such as silicon dioxide, silicon nitride or other dielectric materials.

Conventional crystalline germanium layers are grown in epitaxial growth processes in which the germanium layer grows epitaxially on a seed layer which is also crystalline, typically crystalline silicon. Epitaxial growth processes are performed at high temperatures as high as 650° C. and these films grow at the relatively low growth rates of epitaxial growth. The high temperatures used during the epitaxial growth process can also cause diffusion of atoms and deterioration of underlying layers. For example, when germanium layers are epitaxially grown over CMOS structures that contain a silicon dioxide layer or metal features, processing temperatures higher than 550° C. can adversely affect the properties of the underlying CMOS structures and metal features (such as copper features) by causing diffusion of the atoms of these materials into other adjacent features. Diffusion of metal atoms into adjacent dielectric layers, such as layers of silicon dioxide, can cause deterioration of the dielectric properties of such layers. In addition, the low growth rates of epitaxial processes make them difficult to integrate with the faster CMOS production processes.

Crystalline germanium and silicon-germanium layers have also been deposited on silicon dioxide or metallic substrates using chemical vapor deposition (CVD) processes in combination with a thin polycrystalline silicon seed layer. In these methods, a seed layer comprising polycrystalline silicon is deposited in a sufficiently low thickness to reduce the impact of the electrical properties of the subsequently deposited germanium or silicon-germanium layer. After deposition of the polycrystalline silicon seed layer, a germanium layer is then deposited at elevated temperatures by chemical vapor deposition (CVD) using a germanium-containing precursor gas. However, the seed layer-CVD deposition methods provide relatively slow yields because the germanium layers can have a large incubation time (or time-to-initiate deposition). Also, the resultant deposited film can have a heterogeneous composition, be difficult to initialize, and in some cases, the germanium layer may not deposit on certain substrates.

For various reasons that include these and other deficiencies, and despite the development of crystalline germanium layers and their deposition methods, further improvements in deposition of germanium layers are continuously being sought.

SUMMARY

In a method of depositing a crystalline germanium layer on a substrate, the substrate is placed in a process zone comprising a pair of process electrodes. In a deposition stage, a crystalline germanium layer is deposited on the substrate by introducing a deposition gas comprising a germanium-containing gas into the process zone, and forming a capacitively coupled plasma of the deposition gas by coupling energy to the process electrodes in the process zone to deposit the crystalline germanium layer on the substrate. In a subsequent treatment stage, the deposited crystalline germanium layer is treated by exposing the crystalline germanium layer to an energized treatment gas.

In another method, a crystalline germanium layer is deposited on a substrate by placing a substrate in a process zone, the process zone comprising a pair of process electrodes. In a deposition stage, a crystalline germanium layer is deposited on the substrate by introducing a deposition gas comprising a germanium-containing gas into the process zone, and forming a capacitively coupled plasma of the deposition gas by coupling energy to the process electrodes in the process zone to deposit the crystalline germanium layer on the substrate. In a subsequent treatment stage, the deposited crystalline germanium layer is treated by annealing the crystalline germanium layer at a temperature of less than 650° C.

An electronic device comprises a substrate comprising a CMOS structure comprising a silicon dioxide layer, and a crystalline germanium layer on the silicon dioxide layer, the crystalline germanium layer comprising a grain size of from about 20 nm to about 200 nm.

DRAWINGS

These features, aspects and advantages of the present invention will become better understood with regard to the following description, appended claims and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
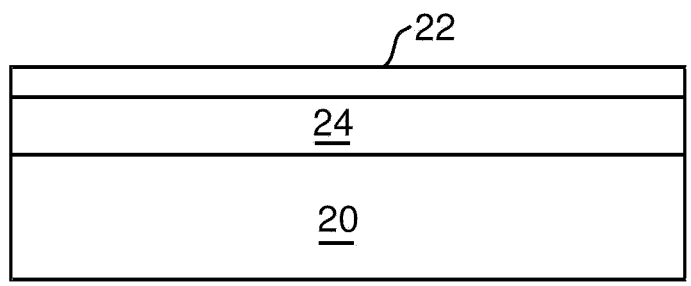
FIG. 1 is a schematic cross-sectional view of a substrate showing a crystalline germanium layer deposited over a dielectric layer.

A crystalline germanium layer 22 is deposited by plasma-enhanced chemical vapor deposition at low temperatures and relatively fast growth rates on a substrate 20, as shown in FIG. 1. The substrate 20 can be, for example, a silicon substrate, an III-V compound such as gallium arsenide, a germanium or silicon-germanium (SiGe) substrate, an epi-substrate, a silicon-on-insulator (SOI) substrate, a display such as a liquid crystal display (LCD), a plasma display, an electroluminescence (EL) lamp display, or a light-emitting diode (LED) substrate. In some embodiments, the substrate 20 may be a semiconductor wafer such as a silicon wafer having a diameter of 200 mm, 300 mm, or even 400 mm. In other cases, the substrate 20 can be a dielectric plate, such as polymer or glass panel, e.g., acrylics, polyimide, and borosilicate and phosphosilicate glass panels.

In the version shown, a crystalline germanium layer 22 is deposited directly onto a dielectric layer 24 which is on the substrate 20. The dielectric layer 24 can have a dielectric constant of greater than 2.2, for example, or even greater than 3.9. The dielectric layer 24 can be, for example, a silicon dioxide layer, silicon nitride layer, silicon oxynitride layer, a low-K dielectric layer such as Black Diamond™ layer (from Applied Materials, Santa Clara, Calif.), or combinations of such layers. The dielectric layer 24 can also be, for example, a portion of an underlying structure, such as a CMOS structure, or can be used to cover interconnect structures such as interconnect lines or contact holes 46. While "layer" is used to describe the crystalline germanium deposits or the underlying dielectric material, it should be understood that by "layer" it is meant a continuous layer, a discontinuous layer, selective deposition of features or even deposition of a layer followed by the etching of features from the layer.

Figure 2A:
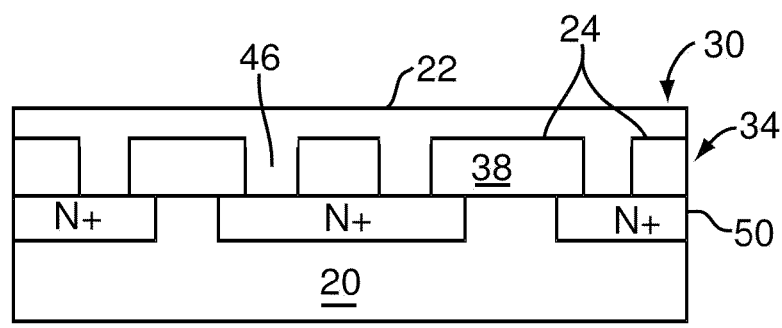
FIG. 2A is a schematic cross-sectional view of a substrate showing a crystalline germanium layer deposited over a dielectric layer covering a plurality of CMOS structures on a substrate.
Figure 2B:
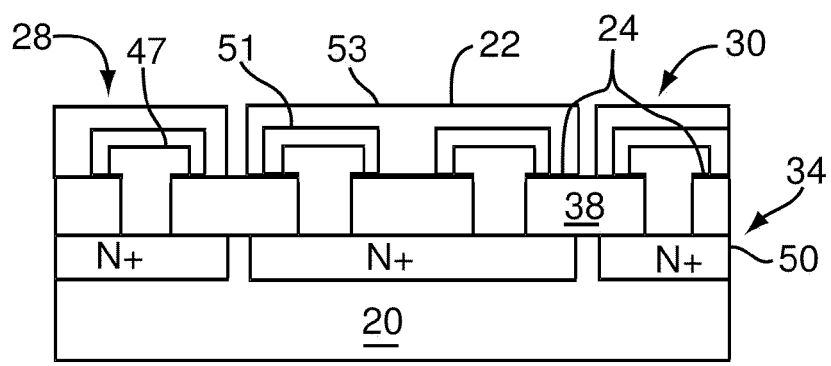
FIG. 2B is a schematic cross-sectional view of the substrate of FIG. 2A showing a photodiode comprising multiple crystalline germanium layers on the substrate.

An exemplary embodiment of a plurality of electronic devices 28 that each comprise one or more crystalline germanium layers 22, which may be doped or undoped, are shown in FIGS. 2A and 2B. In this example, the electronic devices 28 comprise photodiodes 30 which include a crystalline germanium layer 22 deposited on a plurality of complementary metal oxide semiconductor (CMOS) structures 34 on a substrate 20 that is a silicon wafer. The substrate 20 has a dielectric layer 24 comprising spaced-apart silicon dioxide features 38 that overlie the CMOS structures 34 formed in the substrate 20. Each CMOS structure 34 includes N+ features 50 comprising silicon implanted with N+ ions, such as boron or phosphorous, which form a bottom electrode of the photodiode 30. The silicon dioxide features 38 are formed over the CMOS structures 34 by depositing a layer planarized with chemical mechanical polishing and then etching the features 38 with conventional photolithography techniques. In the etching process, contact holes 46 are formed between the silicon dioxide features 38, after which an N+-doped germanium crystalline layer 22 is deposited to fill the contact holes 46 to a thickness above the holes, as shown in FIG. 2A. The crystalline germanium layer 22 is then etched to form the intrinsic germanium overgrowth features 47 covering a portion of the N+ features 50, as shown in FIG. 2B. A P+ germanium layer is then deposited on the substrate 20 and then etched to form the P+ features 51. A polysilicon or indium tin oxide ($In_2O_3$—$SnO_3$-ITO) layer is then deposited and etched again to form the upper electrode 53 of the photodiode 30. For a photodiode 30 that is a germanium-based infrared detector that is sensitive to wavelengths longer than 1000 nm, P+ polysilicon is used because it is infrared transparent, and it is formed by in situ doping of a polysilicon layer or by ion implantation of intrinsic polysilicon. The photodiode 30 with the ITO layer is used for light detection of wavelengths less than 1000 nm. The fabrication method as described is suitable for P—I—N germanium photodiodes; however, the same method can be used to fabricate N—I—P germanium photodiodes by simply changing the n-doped and p-doped layers to p-doped and n-doped layers, respectively.

Figure 3:
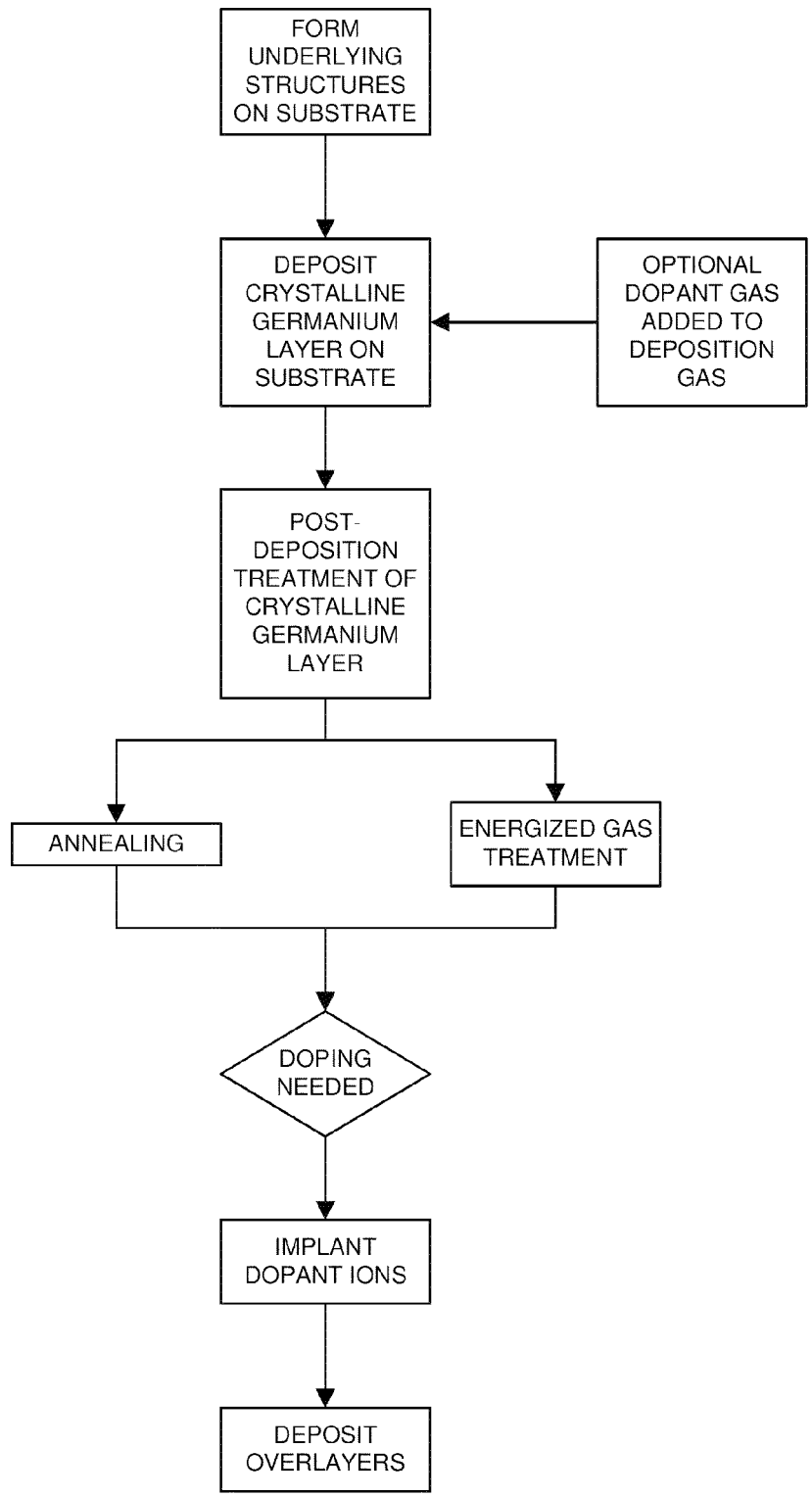
FIG. 3 is a flow chart of an exemplary process for the deposition and treatment of a crystalline germanium layer on a substrate.

In the exemplary fabrication processes described above or other processes for fabricating other structures (e.g., photovoltaic cells or memory devices), the crystalline germanium layer 22 is deposited on the substrate 20 by a plasma-enhanced chemical vapor deposition (PECVD) process, and thereafter, subjected to a post-deposition treatment process, as shown in the exemplary embodiment of the flowchart of FIG. 3. The deposition and/or treatment stages can be repeated a number of times to gradually build up a desired thickness of the deposited germanium layer when each deposited layer is a fraction of the thickness of the final crystalline germanium layer 22.

In one embodiment, the crystalline germanium layer 22 is deposited directly on the dielectric layer 24, for example, directly on the silicon dioxide features 38 (or silicon nitride or silicon oxynitride features). The present deposition process allows formation of a crystalline germanium layer 22 directly on a dielectric layer 24 without a seed layer therebetween. In contrast to conventional epitaxial growth processes, the crystalline germanium layer 22 is deposited by a chemical vapor deposition process, and consequently, is not limited to the slow crystalline growth rates of conventional epitaxial growth processes. Furthermore, the present process can be used to deposit crystalline germanium layers 22 onto many different types of materials, including materials which do not necessarily have a crystalline alignment which is advantageous for epitaxial growth of crystalline germanium.

Still further, the present deposition process does not adversely affect the properties of the dielectric layer 24 comprising dielectric features, or other underlying layers, upon which the crystalline germanium layer 22 is deposited. This is because the present chemical vapor deposition process can be performed at temperatures of less than about 600° C., or even at 400° C. In contrast, conventional epitaxial growth processes used temperatures exceeding 600° C. which result in deterioration of the underlying layers—such as a dielectric layer 24 overlying a CMOS structure 34 or underlying metal layers—because of diffusion of atoms from underlayers during high-temperature epitaxial growth processes. Thus, a crystalline germanium layer 22 deposited according to the present process can be formed directly on dielectric layers 24, and even over dielectric layers 24 covering metal-containing features such as interconnects or contact holes 46. In particular, the present crystalline germanium layer 22 can be deposited directly on dielectric layers 24 composed of silicon dioxide features 38 which can be formed over metal-containing features (not shown) composed of copper and its alloys. For example, when the present deposition processing temperatures are less than 450° C., the diffusion or migration of copper from these features 38 to other portions of the substrate 20 is reduced.

Figure 4:
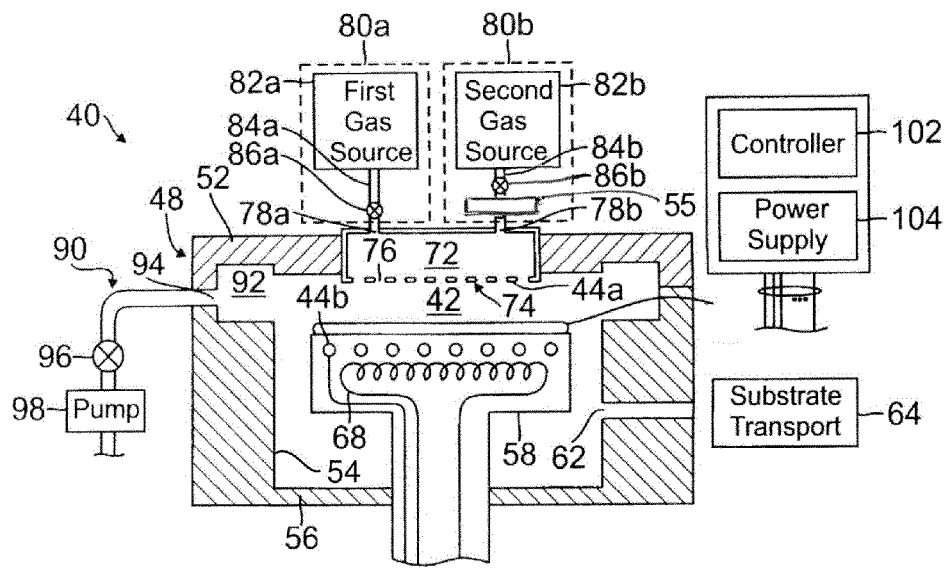
FIG. 4 is a schematic view of an embodiment of a substrate processing chamber comprising a plasma-enhanced chemical vapor deposition (PECVD) chamber.

In the deposition stage of the current process, a substrate 20 comprising a dielectric layer 24 is placed in a process zone 42 of a suitable PECVD process chamber. An exemplary embodiment of a suitable process chamber 40 comprises a Producer® SE chamber, as shown in FIG. 4, and which is fabricated by Applied Materials, Santa Clara, Calif. In the process, a substrate 20, such as a silicon wafer or even a silicon wafer comprising an overlying exposed dielectric layer 24, is placed in the process zone 42 of the process chamber 40.

A deposition gas comprising a germanium-containing gas is introduced into the process zone 42. A suitable germanium-containing gas is germane ($GeH_4$). The germanium-containing gas can also be other germanium-based gases which can serve as a source of germanium for deposition of the crystalline germanium layer 22. A suitable flow rate for the germanium-containing gas, such as germane, is from about 5 to about 1 slm.

The deposition gas may also include a diluent gas to control the properties of the plasma generated from the deposition gas. For example, the diluent gas can improve the uniformity of deposition of the germanium layer 22 by distributing the concentration of germanium atoms in the process chamber 40. The diluent gas can also serve to energize and dissociate the germanium atoms of the germanium-containing gas for reaction via molecular collisions in the process zone 42. Suitable diluent gases can include, for example, argon (Ar), helium (He), hydrogen ($H_2$), or xenon (Xe). The diluent gas is typically provided in a larger volume than the germanium-containing gas to serve as a diluent in the process zone 42. For example, a diluent gas comprising, or consisting of, at least one of argon, helium, hydrogen or xenon can be added in a flow rate of from about 50 sccm to about 10 slm.

The deposition gas may further comprise a dopant gas that serves to dope the germanium layer 22 deposited by the deposition gas. For example, the dopant gas can comprise a dopant-containing material, such as nitrogen or carbon atoms. The dopant atoms are incorporated into the germanium layer 22 to provide semiconducting properties or to alter its optical properties. For example, dopant atoms comprising nitrogen atoms can be provided via a dopant gas comprising a nitrogen-containing gas such as $NH_3$ or $N_2$. The nitrogen-containing gas combines with germanium species to form a germanium nitride film which can serve as a photoluminescence layer. When the germanium layer 22 contains nitrogen, a suitable nitrogen content is from about 1% to about 60% by weight.

An alternative dopant comprises carbon, which is provided by dopant gases such as hydrocarbon gases, e.g., $C_xH_y$, or organometallic precursor compounds. The resultant carbon atoms, when incorporated into germanium layers 22, make the films useful for solar cells, transistors and photodetectors. When the germanium layer 22 contains carbon, a suitable carbon content is from about 1% to about 50% by atomic composition.

The dopant precursor gas is typically provided in a smaller atomic volume than the germanium flow. For example, a dopant gas comprising, or consisting of, nitrogen can be added in a flow rate of from about 5 sccm to about 1 slm. Other dopant gases include diborane ($B_2H_6$) to provide boron atom doping, or phosphine ($PH_3$) to provide phosphorous atom doping.

After the selected composition of deposition gas is introduced into the process zone 42 of the process chamber 40, the deposition gas is maintained at the constant pressure. For example, for a deposition gas comprising germane, a suitable pressure is from about 1 Torr to about 20 Torr. The deposition gas pressure is controlled by controlling a gas exhaust 90, which is controlled by setting the opening size of a throttle valve 96 which connects an exhaust port 94 and piping from the process chamber 40 to an exhaust pump 98. The throttle valve 96 and various mass or volumetric flow meters can also be adjusted during the deposition process to keep the gas pressure and flow rates stable.

A plasma is formed from the deposition gas by coupling energy to the deposition gas. For example, the plasma can be formed by capacitively coupling energy to process electrodes 44a,b about the process zone 42 containing the deposition gas. The energy coupled to the electrodes 44a,b has radio frequencies (RF) of from about 1 KHz to about 20 MHz. In one version, a suitable frequency of the RF energy is from about 10 MHz to about 15 MHz (e.g., about 13.6 MHz). In one embodiment, RF energy is capacitively coupled to the deposition gas by biasing a first electrode 44a comprising a ceiling 52 about the process zone 42 and a second electrode 44b in a substrate support 58, as shown in the exemplary embodiment of FIG. 4. The process electrodes 44a,b are biased coupling RF energy to the electrodes 44a,b at a power level of from about 100 to about 1000 watts (e.g., from about 200 to about 400 watts). In an exemplary chamber 40, the process electrodes 44a,b are maintained at an electrode spacing distance of from about 5 mm (200 mils) to about 15 mm (600 mils).

During deposition, the substrate 20 is maintained at a lower temperature than conventional epitaxial growth processes. For example, the substrate 20 can be maintained at a temperature of less than 650° C. or even less than 600° C. Temperatures less than 500° C., such as from about 300° C. to about 500° C., or even below 450° C., are particularly advantageous as they do not thermally degrade other process results or features of the substrate 20. In these processes, the substrate temperature can be controlled, for example, by supplying a heat transfer fluid to a heat exchanger (not shown) in the substrate support 58 to cool or heat the substrate 20 below the substrate 20. Alternatively, a heater 68 (as shown) in the substrate support 58 can be used to heat the substrate 20 when the plasma temperatures are not sufficiently high to induce deposition of the deposition gas.

In the deposition process, germanium species such as ions and radicals in the plasma deposit a crystalline germanium layer 22 directly onto the substrate 20 without first depositing a seed or nucleation layer, consisting of polycrystalline silicon, on the substrate 20. Advantageously, the present deposition process does not require a polycrystalline silicon seed layer, and the germanium layer 22 can be deposited directly over a dielectric layer 24 comprising a dielectric layer 24, such as a layer of silicon dioxide. Still further, the lower substrate processing temperatures of below 450° C. are compatible to back-end CMOS processing. Further, the intrinsic properties of the deposited germanium layer 22, including its crystal fraction, crystal grain sizes and distribution, carrier density, and stress, can be tailored by controlling chamber temperature, pressure, plasma volume, plasma power, the ratio of the flow rates of different gas components of the deposition gas, and other available process parameters. The ability to deposit a germanium layer 22 with controlled properties is not always available from conventional epitaxial or CVD processes which rely on matching the crystalline structure of the seed layer upon which the germanium layer 22 is grown.

Advantageously, the crystalline germanium layer 22 is a polycrystalline germanium comprising a grain size of from about 20 nm to about 200 nm. In one version, the polycrystalline germanium can have grains with good crystallographic orientations that have miller indices orientations of any one or more of (111), (220) and (311). Furthermore, the deposition rates obtained for the crystalline germanium are also good and vary from about 10 nm/min to about 50 nm/min. These deposition rates are about 5 to about 10 times faster than the deposition rates generated in conventional epitaxial germanium deposition processes when the conventional processes use higher temperatures of 600° C. to 680° C. and high pressures. This represents a surprising and unexpected advantage over conventional deposition rates.

Still another novel feature of the present deposition process comprises a post-deposition treatment stage which is conducted after the deposition of the crystalline germanium layer 22 on the substrate 20. The treatment stage further controls the crystalline properties of the deposited crystalline germanium layer 22. Various embodiments of the treatment stage are possible. In one embodiment, the deposited crystalline germanium layer 22 is treated with an energized treatment gas comprising at least one of argon (Ar), helium (He), hydrogen ($H_2$), nitrogen ($N_2$), xenon (Xe), or combinations of these gases. The energized treatment gas can be formed in the process chamber 40 by inductively or capacitively coupling power to a treatment gas introduced into the process zone 42 or by coupling energy to a treatment gas in a remote chamber 55. In the first example, the energized treatment gas comprises a plasma formed between the process electrodes 44$a,b$ in the process zone 42 containing the treatment gas. The energy coupled to the electrodes 44$a,b$ has radio frequencies (RF) of from about 100 KHz to about 100 MHz. In one version, a suitable frequency of the RF energy is from about 10 MHz to about 20 MHz, (e.g., about 13.5 MHz). For example, RF energy can be applied to the first electrode 44$a$ about the process zone 42 and the second electrode 44$b$ in the substrate support 58. In this version, the RF energy is applied to the process electrodes 44$a,b$ at a power level of from about 5 watts to about 1500 watts for a time period of from about 3 seconds to about 10 minutes. In the exemplary chamber 40, the process electrodes 44$a,b$ are maintained at an electrode spacing distance of from about 5 mm (200 mils) to about 25 mm (1000 mils). In the treatment process, the substrate 20 is also maintained at a temperature of less than 650° C., or even less than 600° C. Temperatures less than 500° C., such as from about 300° C. to about 500° C., or even below 450° C., are particularly advantageous as they do not thermally degrade other process results or features previously formed on the substrate 20.

In another version, an energized treatment gas comprising a plasma is formed from the treatment gas by the inductive coupling of energy to the treatment gas in the process chamber 40 by passing a current through an antenna (not shown) outside the chamber 40. For example, the antenna can be located above the ceiling 52 of the chamber 40 around the sidewalls 54 of the chamber 40. In this step, RF energy is applied to the antenna at a power level of from about 10 watts to about 5000 watts (e.g., from about 100 watts to about 3000 watts) for a time period of from about 3 seconds to about 10 minutes.

In still another version, an energized treatment gas comprising activated species is formed by coupling energy, such as microwave energy, to the treatment gas in a remote chamber 55 to form the energized treatment gas, and thereafter, the energized treatment gas is introduced into the process zone 42 of the process chamber 40. For example, the energy coupled to the treatment gas can be microwave energy which is applied in the remote chamber 55 at a frequency of from about 50 kHz to about 100 MHz (e.g., about 100 kHz). The remotely energized treatment gas can also be formed by applying RF energy to an induction coil (not shown) wrapped around the remote chamber 55. Suitable frequencies of the RF energy coupled to the treatment gas can be from about 100 kHz to about 100 MHz (e.g., about 13.6 MHz). The crystalline germanium layer 22 on the substrate 20 is exposed to the remotely energized treatment gas for a time period of from about 3 seconds to about 10 minutes.

In another embodiment, the post-deposition treatment process comprises heat-treating the deposited crystalline germanium layer 22 on the substrate 20 in an annealing step at a temperature below 600° C. A suitable annealing step comprises maintaining the substrate 20 of the deposited germanium layer 22 at a temperature below 600° C., such as of from about 300° C. to about 450° C. (e.g., about 400° C.) for a time period of from about 1 minute to about 1 hour. In another embodiment, the substrate 20 with the deposited germanium layer 22 is heat-treated in the annealing step before or after a post-deposition energized gas treatment, such as a plasma or microwave-activated gas treatment. The annealing treatment step can also be conducted by heating the substrate 20 while exposing the crystalline germanium layer 22 on the substrate 20 to a treatment gas comprising at least one of argon (Ar), helium (He), hydrogen ($H_2$), nitrogen ($N_2$), xenon (Xe), or combinations of these gases. The annealing process step further refines the crystalline properties of the deposited germanium layer 22. For example, the annealing step can result in film stress tuning, higher crystalline fraction, larger grain, and better distribution of grain size.

The crystalline germanium layer 22 can include other species such as a dopant species, e.g., nitrogen, carbon, boron and phosphorous. The dopant species can be incorporated in the crystalline germanium layer 22 during the deposition process by adding a dopant gas to the deposition gas. For example, a dopant gas comprising nitrogen can be added to the deposition gas comprising a germane to deposit a nitrogen-doped crystalline germanium layer 22 on the substrate 20. Alternatively, a separate doping process can be used to implant dopant ions into the deposited and/or treated crystalline germanium layer 22. The doping process can be performed immediately after deposition of the crystalline germanium layer 22 on the substrate 20 or after treatment of the crystalline germanium layer 22 (as shown). In a conventional implantation process, plasma of the dopant ion is formed in the process zone 42 of the process chamber 40 to implant the dopant ions into the crystalline germanium layer 22. For example, to implant nitrogen ions into the crystalline germanium layer 22, a dopant gas comprising nitrogen is introduced into the process zone 42 and energized by capacitively coupling RF energy to the process electrodes 44$a,b$, as described above, or other conventional ion implantation processes.

After the optional doping step, subsequent processes can be used to deposit overlayers onto the crystalline germanium layer 22, which may include further crystalline germanium layers, or crystalline germanium layers doped with different materials. Thus, a first crystalline germanium layer comprising a first dopant can be covered by a second crystalline germanium layer comprising a second dopant. For example, a subsequent crystalline germanium layer 22 can be deposited over the first crystalline germanium layer 22 and doped with phosphorous to form an n-type germanium layer or with boron to form a p-type germanium layer, carbon, or other dopants. The dopants, such as phosphorous or boron, can be added in the form of $PH_3$ or $B_2H_6$ gases, respectively, during the deposition process or subsequently implanted into the deposited crystalline germanium layer 22 using a conventional ion implantation process.

In one version, the deposition and treatment stages are repeated a number of times to obtain a desired thickness of the deposited crystalline germanium layer 22. For example, a first deposition stage can be conducted for a time of from about 5 seconds to about 60 seconds to deposit a first layer having a thickness of from about 10 angstroms to about 500 angstroms. The deposited first layer is then treated in a treatment stage, for example, by exposing that deposited layer to a plasma or by annealing, as previously described. The treatment stage serves to rearrange bond structure in the deposited first layer so that film density, crystal fraction, and electron-hole recombination site density can be modulated. Then, a second deposition stage is conducted for a time of from about 5 seconds to about 60 seconds to deposit a second layer having a thickness of from about 10 angstroms to about 500 angstroms. The deposited second layer is then treated in a treatment stage, for example, by exposing the deposited second layer to a plasma or by annealing the second layer. This process can be repeated a number of times to achieve the desired thickness for a particular application of the crystalline germanium layer 22. A suitable thickness for the cumulative layer deposited to form the final crystalline germanium layer 22 can be from about 100 angstroms to about 5 microns.

Both the deposition stage and the treatment stages, or the plurality of deposition and treatment stages conducted in sequence, can be performed in the same process chamber 40, or the deposition and treatment steps can be performed in separate chambers (not shown), each of which is capable of either deposition or treatment processes. An embodiment of a substrate processing chamber 40, which can be used to perform the germanium deposition and post-deposition treatment processes described above, is illustrated in FIG. 4. The chamber 40 is provided to illustrate an exemplary chamber; however, other chambers may also be used as would be apparent to one of ordinary skill in the art. Accordingly, the scope of the invention should not be limited to the exemplary chamber described herein. Generally, the chamber 40 is a plasma-enhanced chemical vapor deposition (PECVD) chamber suitable for processing a substrate 20 such as a silicon wafer, a suitable chamber being a Producer® SE type chamber from Applied Materials, Santa Clara, Calif. The chamber 40 comprises enclosure walls 48, which include a ceiling 52, sidewalls 54, and a bottom wall 56, that enclose a process zone 42. The chamber 40 may also comprise a liner (not shown) that lines at least a portion of the enclosure walls 48 about the process zone 42. For processing a substrate 20 comprising a 300 mm silicon wafer, the chamber 40 typically has a volume of about 20,000 to about 30,000 $cm^3$, and more typically about 24,000 $cm^3$.

During a process cycle, the substrate support 58 is lowered, and a substrate 20 is passed through an inlet port 62 and placed on the support 58 by a substrate transport 64, such as a robot arm. The substrate support 58 can be moved between a lower position for loading and unloading and an adjustable upper position for processing of the substrate 20. The substrate support 58 can include an enclosed electrode 44a to generate a plasma from deposition or treatment gas introduced into the chamber 40. The substrate support 58 can also be heated by heater 68, which can be an electrically resistive heating element (as shown), a heating lamp (not shown), or the plasma itself. The substrate support 58 typically comprises a ceramic structure which has a receiving surface to receive the substrate 20 and which protects the electrode 44a and heater 68 from the chamber 40 environment. In use, a radio frequency (RF) voltage is applied to the electrode 44a and a direct current (DC) voltage is applied to the heater 68. The electrode 44a in the substrate support 58 can also be used to electrostatically clamp the substrate 20 to the support 58. The substrate support 58 may also comprise one or more rings, such as deposition rings and cover rings (not shown), that at least partially surround a periphery of the substrate 20 on the support 58.

After a substrate 20 is loaded onto the substrate support 58, the support 58 is raised to a processing position that is closer to the gas distributor 72 to provide a desired spacing gap distance, $d_s$, therebetween, e.g., of from about 2 mm to about 12 mm. The gas distributor 72 is located above the process zone 42 for dispersing a deposition or treatment gas uniformly across the substrate 20. The gas distributor 72 can separately deliver two independent streams of first and second gases to the process zone 42 without mixing the gas streams prior to their introduction into the process zone 42, or it can premix the gases before providing the premixed gases to the process zone 42. The gas distributor 72 comprises a faceplate 74 having holes 76 that allow the passage of deposition or treatment gas therethrough. The faceplate 74 is typically made of metal to allow the application of a voltage or potential thereto and thereby serves as electrode 44a in the chamber 40. A suitable faceplate 74 can be made of aluminum with an anodized coating.

The substrate processing chamber 40 also comprises first and second gas supplies 80a,b to deliver the different gases to the gas distributor 72, the gas supplies 80a,b each comprising a gas source 82a,b, one or more gas conduits 84a,b, and one or more gas valves 86a,b. For example, in one version, the first gas supply 80a comprises a first gas conduit 84a and a first gas valve 86a to deliver a first process gas, such as the deposition gas, a treatment gas, or components of either of these gases, from the first gas source 82a to a first inlet 78a of the gas distributor 72, and the second gas supply 80b comprises a second gas conduit 84b and a second gas valve 86b to deliver a second process gas, such as the deposition gas, treatment gas, or components of either of these gases, from the second gas source 82b to a second inlet 78b of the gas distributor 72.

The deposition and treatment gas can be energized by coupling electromagnetic energy (e.g., high frequency voltage energy) to the gas in the process chamber 40 or in the remote chamber 55 to form an energized gas, such as a plasma, from the deposition or treatment gas. To energize the supplied gas in the chamber 40, a voltage is applied between (i) a first electrode 44a, which may be the gas distributor 72, ceiling 52, or chamber sidewall 54, and (ii) the electrode 44b in the support 58. The voltage applied across the pair of electrodes 44a,b capacitively couples energy to the deposition or treatment gas in the process zone 42. Typically, the voltage applied to the electrodes 44a,b is an alternating voltage which oscillates at a radio frequency (RF). The gas passed to the remote chamber 55 is energized using microwave energy supplied by a microwave generator (not shown) or RF energy supplied to an induction coil (not shown) wrapped around the remote chamber 55.

The chamber 40 also comprises a gas exhaust 90 to remove spent gas and byproducts from the chamber 40 and maintain a predetermined pressure of deposition or treatment gas in the process zone 42. In one version, the gas exhaust 90 includes a pumping channel 92 that receives spent gas from the process zone 42, an exhaust port 94, a throttle valve 96 and one or more exhaust pumps 98 to control the pressure of gas in the chamber 40. The exhaust pumps 98 may include one or more of a turbo-molecular pump, cryogenic pump, roughing pump, and combination-function pumps that have more than one function. The chamber 40 may also comprise an inlet port or tube (not shown) through the bottom wall 56 of the chamber 40 to deliver a purging gas into the chamber 40. The purging gas typically flows upward from the inlet port past the substrate support 58 and to an annular pumping channel. The purging gas is used to protect surfaces of the substrate support 58 and other chamber components from undesired deposition during the processing. The purging gas may also be used to affect the flow of gas in a desirable manner.

A controller 102 is also provided to control the operation and operating parameters of the chamber 40. The controller 102 may comprise, for example, a processor and memory. The processor executes chamber control software, such as a computer program stored in the memory. The memory may be a hard disk drive, read-only memory, flash memory, or other types of memory. The controller 102 may also comprise other components, such as a floppy disk drive and a card rack. The card rack may contain a single-board computer, analog and digital input/output boards, interface boards, and stepper motor controller boards. The chamber control software includes sets of instructions that dictate the timing, mixture of gases, chamber pressure, chamber temperature, microwave power levels, high frequency power levels, support position, and other parameters of a particular process.

The chamber 40 also comprises a power supply 104 to deliver power to various chamber components such as, for example, the first electrode 44a in the chamber 40 and the second electrode 44b in the substrate support 58. To deliver power to the chamber electrodes 44a,b, the power supply 104 comprises a radio frequency voltage source that provides a voltage having the selected radio frequencies and the desired selectable power levels. The power supply 104 can include a single radio frequency voltage source, or multiple voltage sources that provide both high and low radio frequencies. The power supply 104 can also include an RF matching circuit. The power supply 104 can further comprise an electrostatic charging source to provide an electrostatic charge to an electrode which is often the electrostatic chuck of the substrate support 58. When a heater 68 is used within the substrate support 58, the power supply 104 also includes a heater power source that provides an appropriate controllable voltage to the heater 68. When a DC bias is to be applied to the gas distributor 72 or the substrate support 58, the power supply 104 also includes a DC bias voltage source that is connected to a conducting metal portion of the faceplate 74 of the gas distributor 72. The power supply 104 can also include the source of power for other chamber components, for example, motors and robots of the chamber 40.

The substrate 20 processing chamber 40 can also include one or more temperature sensors (not shown) such as thermocouples, RTD sensors, or interferometers to detect the temperature of surfaces such as component surfaces or substrate surfaces within the chamber 40. The temperature sensor is capable of relaying its data to the chamber controller 102 which can then use the temperature data to control the temperature of the processing chamber 40, for example, by controlling the resistive heating element in the substrate support 58.

EXAMPLES

The following illustrative examples demonstrate the effectiveness and advantages of the crystalline germanium deposition and treatment processes. The germanium deposition process and the crystalline germanium layer and structures described herein will become better understood with regard to these illustrative examples. However, it should be understood that each of the features described herein can be used by itself or in any combination with each other, and not merely as described in a particular example. Thus, the illustrative examples provided herein should not be used to limit the scope of the present invention.

In these examples, a crystalline germanium layer 22 was deposited in the PECVD Producer® chamber with the following process conditions: deposition gas comprising germane at a volumetric flow rate of 5 sccm and 100 sccm; deposition gas pressure of 5 Torr to 15 Torr; substrate temperature of 400° C.; RF energy at a frequency of 13.6 MHz supply supplied to the process electrodes 44a,b at a power level of 30 watts to 300 watts; and process electrodes 44a,b maintained at a spacing of 300 mils to 800 mils. The deposition rate was measured at about 15 nm/minute.

After the deposition process, a treatment process was conducted with the following process conditions: treatment gas comprising $H_2$ at a volumetric flow rate of from 1 slm to 10 slm; treatment gas pressure of 5 Torr to 15 Torr; substrate temperature of 400° C.; RF energy at a frequency of 13.6 MHz supply supplied to the process electrodes 44a,b at a power level of 100 watts to 500 watts; and process electrodes 44a,b maintained at a spacing of 300 mils to 800 mils.

Figure 5:
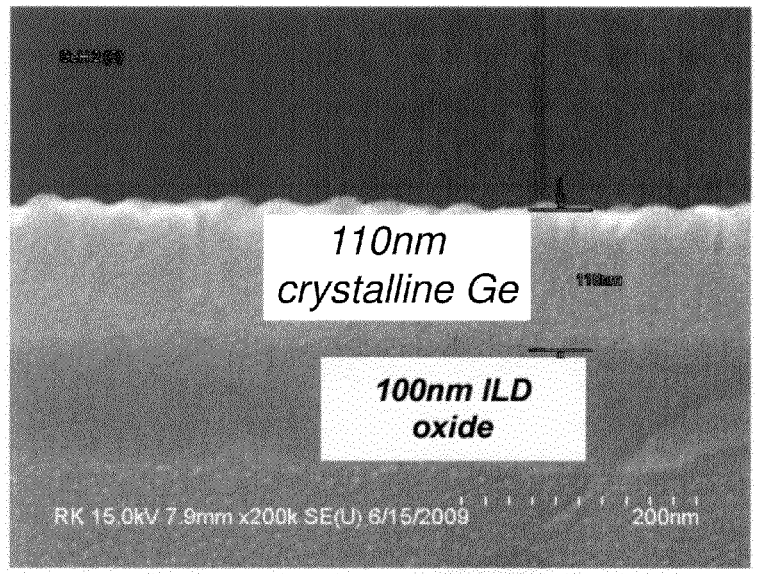
FIG. 5 is a scanning electron micrograph of a crystalline germanium layer deposited on a 100 nm silicon oxide layer on a silicon substrate.

A scanning electron image of the crystalline germanium layer on a 100 nm interlayer dielectric (ILD) oxide layer on a substrate comprising a silicon wafer is shown in FIG. 5. The crystalline germanium layer had a thickness of about 110 nm and was deposited on an ILD oxide film having a thickness of about 100 nm. The crystalline germanium film also provided a substantially uniform thickness across the substrate that varied by less than 5%.

Figure 6:
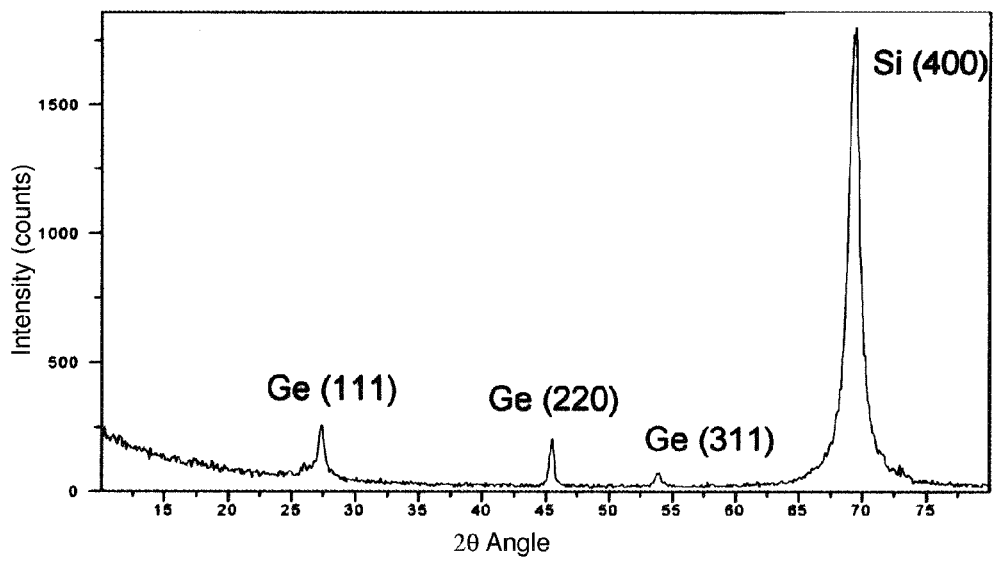
FIG. 6 is a graph of a wide angle X-ray diffraction scan of the crystalline germanium layer.
Figure 7:
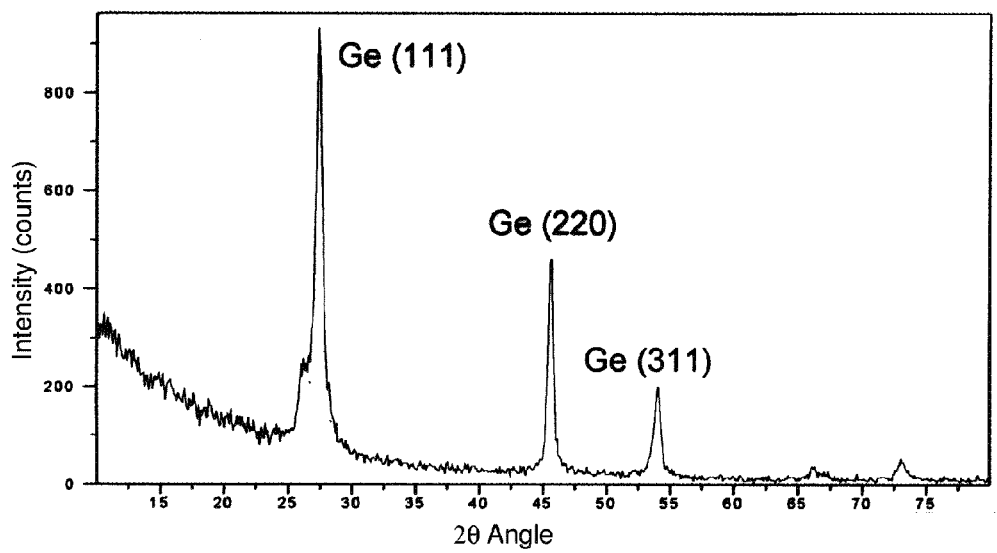
FIG. 7 is a graph of a glancing ray diffraction scan of the crystalline germanium layer.
Figure 8:
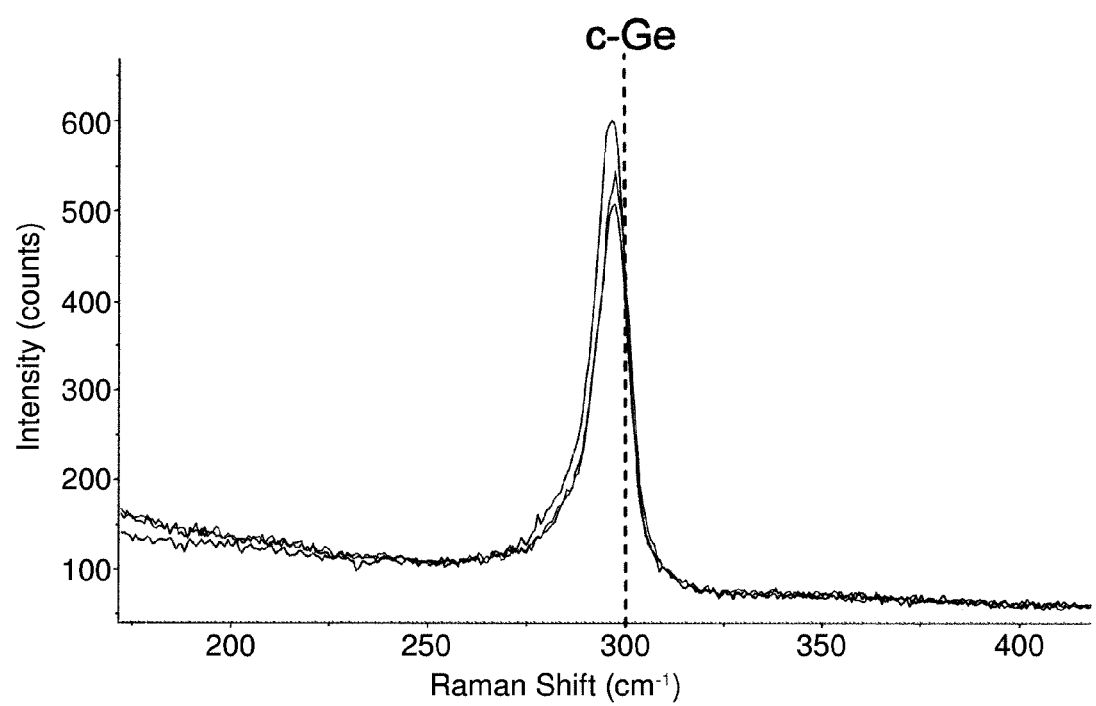
FIG. 8 is a graph of a Raman shift scan of the crystalline germanium layer.

The strong presence of crystalline germanium phase in deposited layer was confirmed by X-ray diffraction (XRD) and, as shown in FIGS. 6 and 7. Referring to FIG. 6, the presence of strong XRD peaks indicate the existence of large amount of the crystalline germanium phase. FIG. 6 is a wide angle X-ray diffraction scan of the germanium layer 22 which shows the presence of crystalline germanium (111), (220) and (311) peaks, along with a crystalline silicon substrate (400) peak. The presence of three different crystallographic orientations shows that the deposited crystalline germanium was polycrystalline in nature and absent a single orientation. FIG. 7 is a glancing ray diffraction scan of the germanium layer 22 which shows a more pronounced presence of crystalline germanium having a miller indices orientation of (111), with less pronounced (220) and (311) orientations. FIG. 8 shows the Raman shift which further confirms the presence of crystalline germanium in polycrystalline forms with multiple crystal orientations, as opposed to conventional epitaxial growth crystalline films which exhibit a primary crystalline orientation.

The crystalline germanium layer 22 produced according to the deposition and treatment processes described above provided excellent crystalline properties, good compositional uniformity, and a uniform thickness across the substrate 20. Furthermore, the crystalline germanium layer 22 can be deposited at temperatures below 450° C., or even at 400° C. Furthermore, the plasma-enhanced chemical vapor deposition method allowed deposition of a crystalline germanium layer 22, such as a polycrystalline layer, on an exposed surface comprising a dielectric layer 24, such as silicon dioxide (e.g., a silicon dioxide interlayer dielectric (ILD) layer) without first depositing a seed layer on this surface. Furthermore, the deposition rates provided by the CVD process is higher than conventional epitaxial growth processes at rates which were about 5 to 10 times faster than conventional epitaxial growth processes. In addition, the crystalline properties of the deposited crystalline germanium can be set by tuning the process with respect to crystal fraction, grain size, grain size distribution, and stress.

Although exemplary embodiments of the present invention are shown and described, those of ordinary skill in the art may devise other embodiments which incorporate the present invention and which are also within the scope of the present invention. Furthermore, the terms "below", "above", "bottom", "top", "up", "down", "first" and "second" and other relative or positional terms are shown with respect to the exemplary embodiments in the figures and are interchangeable. Therefore, the appended claims should not be limited to the descriptions of the preferred versions, materials, or spatial arrangements.

What is claimed is:

1. A method of depositing a crystalline germanium layer on a substrate comprising a dielectric layer, the method consisting essentially of:
   (a) in a deposition stage, depositing a crystalline germanium layer directly on the dielectric layer on the substrate by:
      (i) introducing a deposition gas comprising a germanium-containing gas into a process zone; and
      (ii) forming a capacitively coupled plasma of the deposition gas by coupling energy to a pair of process electrodes in the process zone to deposit the crystalline germanium layer on the substrate; and
   (b) in a treatment stage, treating the crystalline germanium layer by exposing the crystalline germanium layer to an energized treatment gas.

2. A method according to claim 1 where (a) comprises depositing the crystalline germanium layer directly on the dielectric layer without a seed layer therebetween.

3. A method according to claim 1 wherein the dielectric layer comprises a silicon dioxide layer.

4. A method according to claim 3 wherein the silicon dioxide layer comprises a portion of a CMOS structure.

5. A method according to claim 1 where in (a)(i), the germanium-containing gas comprises germane.

6. A method according to claim 1 wherein (a)(ii) comprises maintaining the substrate at a temperature of less than about 650° C.

7. A method according to claim 1 where in (a)(i), the deposition gas comprises a diluent gas comprising at least one of argon, helium, hydrogen or xenon.

8. A method according to claim 1 where (a)(ii) comprises coupling RF energy to the process electrodes at a power level of from about 5 watts to about 1500 watts.

9. A method according to claim 1 where (b) comprises forming the energized treatment gas by coupling microwave energy to a treatment gas in a remote zone to form the energized treatment gas, and introducing the energized treatment gas into the process zone.

10. A method according to claim 1 where (b) comprises treating the crystalline germanium layer in an energized treatment gas comprising at least one of argon, helium, hydrogen, nitrogen or xenon.

11. A method according to claim 1 where (b) comprises maintaining the substrate at a temperature of less than about 650° C.

12. A method according to claim 1 where (a) comprises depositing a crystalline germanium layer containing carbon.

13. A method according to claim 12 where the carbon content is from about 1% to about 50% by atomic composition.

14. A method according to claim 1 where (a) comprises depositing a crystalline germanium layer containing nitrogen.

15. A method according to claim 14 where the nitrogen content is from about 1% to about 60% by weight.

16. A method according to claim 1 wherein the deposition and treatment stages are repeated a number of times.

17. A method of depositing a crystalline germanium layer on a substrate comprising a dielectric layer, the method consisting essentially of:
   (a) in a deposition stage, depositing a crystalline germanium layer directly on the dielectric layer on the substrate by:
      (i) introducing a deposition gas comprising a germanium-containing gas into a process zone; and
      (ii) forming a capacitively coupled plasma of the deposition gas by coupling energy to a pair of process electrodes in the process zone to deposit the crystalline germanium layer on the substrate; and
   (b) in a treatment stage, treating the crystalline germanium layer by exposing the crystalline germanium layer to an energized treatment gas, and annealing the crystalline germanium layer at a temperature of less than about 650° C.

18. A method according to claim 17 wherein in (b) the substrate is maintained at a temperature of from about 300° C. to about 500° C.

19. A method according to claim 17 where (a) comprises depositing a crystalline germanium layer containing carbon.

20. A method according to claim 19 where the carbon content is from about 1% to about 50% by atomic composition.

21. A method according to claim 17 where (a) comprises depositing a crystalline germanium layer containing nitrogen.

22. A method according to claim 21 where the nitrogen content is from about 1% to about 60% by weight.

23. A method according to claim 17 wherein the deposition and treatment stages are repeated a number of times.

24. A method of depositing a crystalline germanium layer on a substrate, the method comprising:
   (a) placing a substrate in a process zone comprising a pair of process electrodes; and
   (b) in the deposition stage, depositing on the substrate, a crystalline germanium layer containing carbon or nitrogen by:
      (i) introducing into the process zone, a deposition gas comprising a germanium-containing gas; and
      (ii) forming a capacitively coupled plasma of the deposition gas by coupling energy to the pair of process electrodes in the process zone to deposit on the substrate, the crystalline germanium layer containing carbon or nitrogen.

25. A method according to claim 24 where in (a), the substrate comprises a dielectric layer, and wherein (b) comprises depositing the crystalline germanium layer directly on the dielectric layer and without a seed layer therebetween.

26. A method according to claim 25 where in (a), the dielectric layer comprises a silicon dioxide layer or a portion of a CMOS structure.

27. A method according to claim 25 further comprising treating the crystalline germanium layer by coupling microwave energy to a treatment gas in a remote zone to form an energized treatment gas, and introducing the energized treatment gas into the process zone.

28. A method according to claim 25 further comprising treating the crystalline germanium layer by heating the crystalline germanium layer.

29. A method according to claim 24 where the carbon content is from about 1% to about 50% by atomic composition.

* * * * *